United States Patent [19]

Doumani et al.

[11] Patent Number: 4,997,389
[45] Date of Patent: Mar. 5, 1991

[54] PLANAR CONNECTOR SYSTEM WITH ZERO INSERTION FORCE AND DISTRIBUTED CLAMPING

[75] Inventors: George A. Doumani, Andover; William J. Pauplis, Hudson; Victor M. Samarov, Carlisle, all of Mass.

[73] Assignee: Digital Equipment Corporation, Maynard, Mass.

[21] Appl. No.: 507,360

[22] Filed: Apr. 10, 1990

[51] Int. Cl.⁵ .............................................. H01R 13/00
[52] U.S. Cl. .................................................... 439/493
[58] Field of Search ................................. 439/492–499

[56] References Cited

U.S. PATENT DOCUMENTS

| | | | |
|---|---|---|---|
| 3,629,787 | 12/1971 | Wilson | 439/493 |
| 4,060,889 | 12/1977 | Zielinski | 439/493 |
| 4,111,510 | 9/1978 | Zurcher | 439/493 |
| 4,252,389 | 2/1981 | Olsson | 439/493 |

Primary Examiner—Joseph H. McGlynn
Attorney, Agent, or Firm—Neuman, Williams, Anderson & Olson

[57] ABSTRACT

A simple and compact removable interconnect for coupling clusters of contact pads on substantially planar circuit substrates together with uniform loading on all of the contact pads in the clusters.

32 Claims, 3 Drawing Sheets

Fig. 3
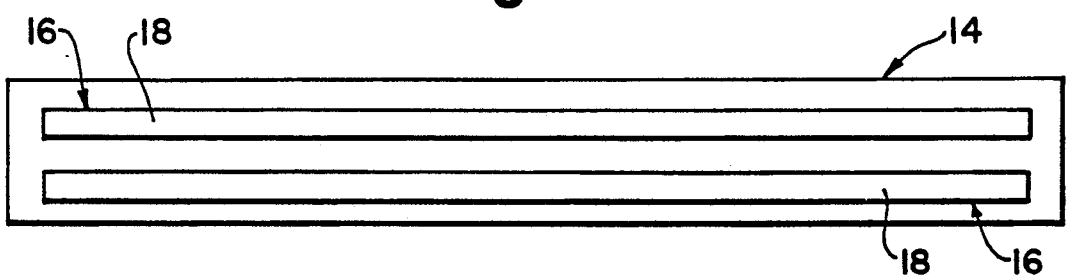
Fig. 4
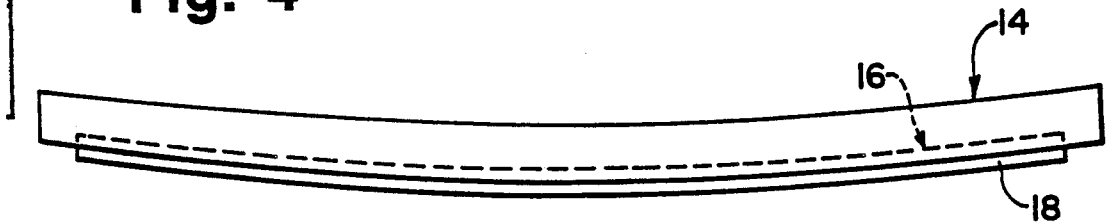
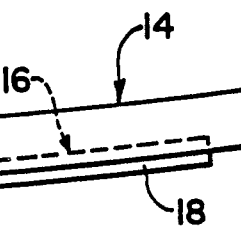
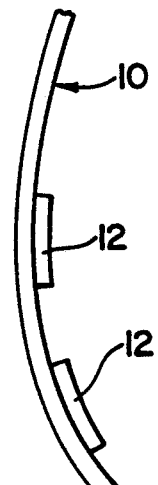
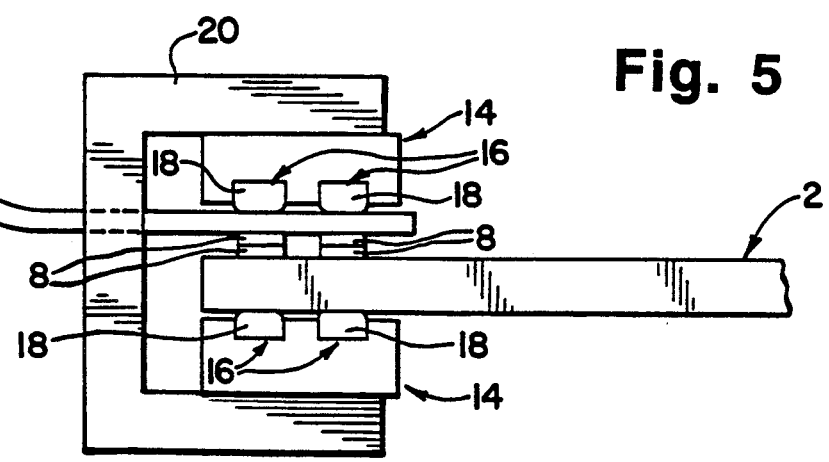
Fig. 5

PLANAR CONNECTOR SYSTEM WITH ZERO INSERTION FORCE AND DISTRIBUTED CLAMPING

FIELD OF THE INVENTION

The present invention relates to electrical connectors for coupling planar electrical terminations, and more particularly to a removable interconnect with zero insertion force for coupling contacts on a planar substrate to contacts on flexible circuits or connecting cables.

BACKGROUND OF THE INVENTION

Electroluminescent panels (ELP's) are generally coupled to an associated controller board with flexible circuits (FC's) having drive circuitry that interconnects electrical signals between rows of contacts on the perimeter of the ELP and the controller board. Several categories of such couplings are used for this such purpose, such as those of the anisotropic adhesive, the direct pad-to-pad welded, the elastic interlayered, and the direct pressure contact types.

Anisotropic adhesives provide one sort of coupling between ELP's and FC's. These adhesives comprise an adhesive layer filled with electrically conductive microspheres brought into contact with each other and with respective mutually aligned contact pads on the ELP and FC's under localized pressure from these pads on the opposite sides of the layer.

Anisotropic adhesives have numerous disadvantages for use as such interconnects. These disadvantages include the need for dispensing equipment, limited adhesive shelf life, difficulty of disassembly and repair, and possibility of contact-point migration in the direction of thermoexpansion or thermocontraction that contributes to possible shorts with adjacent ELP contacts.

Direct pad-to-pad welding or bonding provides another sort of coupling between ELP's and FC's. Such connections are extremely difficult to disassemble and repair, and assembly requires the use of complex and expensive equipment. Due to a considerable thermoexpansion coefficient mismatch between known ELP and FC materials, the cyclical increases in the interconnect temperature from its assembly to full power-up result in rather high shear stress in the bonds and respective flexural loads on the glass, potentially leading to failures.

An elastomeric interlayer compressed between the ELP and FC's provides still another sort of coupling between the ELP and FC's. Unidirectional conductivity through the elastomeric interlayer between the contacts on the ELP and the FC's is provided by the compressed regions of the interlayer along metal traces on the surface of the interlayer or metal particles through the interlayer.

Such couplings require high rigidity for maintaining the degree of compression necessary to maintain sufficient electrical contact. The extra parts and space required to establish and maintain this compression increase the complication and size of the coupling. There is also a possibility of contact-point migration in the direction of thermoexpansion or thermocontraction, causing shorts between adjacent contacts of the ELP and FC's.

A significant improvement over the above described types of connectors is the direct pressure contract connector. Various types of direct pressure contact connectors are known that are useable for coupling the ELP to the FC's. Such connectors are more desirable than the other types described above, especially the adhesive types, because they are generally removable and they can be designed to require no insertion force for installation. One example of such a connector comprises clip members that are used to fasten planar electrical terminations on a panel to planar electrical terminations on flexible interconnection strips.

A special mounting tool is used to mount and remove each clip along the edge of the panel with zero insertion force. The mounting and removal of the clips with the special tool requires a large amount of clearance around the edges of the panel.

Another example of a direct pressure contact connector that provides zero insertion force between electrical terminations on a panel and on flexible interconnection strips has a clamping bar that clamps the flexible strips against the panel with a plurality of springs as the connector is engaged with the edge of the panel. This connector requires a large amount of clearance around the edge of the ELP for installation. The springs concentrate the applied force along a narrow lengthwise strip of the ELP-FC interface, so that a large amount of spring force may provide still less than optimal electrical contact.

SUMMARY OF THE INVENTION

The present invention overcomes the limitations of prior art connectors described above with a direct pressure contact connector that has upper and lower pressure beams with elastic pressure pads mounted on opposite sides of the ELP-FC interface and clamped together with C-clamp type fasteners. The pressure beams have special preformed curvatures to provide equal loading across their contact area with the ELP-FC interface when the pressure beams are clamped together. This fastener also has zero insertion force and requires little clearance for installation and removal.

DESCRIPTION OF THE DRAWINGS

FIG. 3 is a contact surface view of a pressure beam for an embodiment of the connector according to the present invention.

FIG. 4 is a longitudinal edge view of the pressure beam shown in FIG. 3.

FIG. 5 is a cross section of the embodiment of the connector according to the present invention coupling the ELP of FIG. 1 with the FC of FIG. 2.

DESCRIPTION OF THE PREFERRED EMBODIMENT

Figure 1:
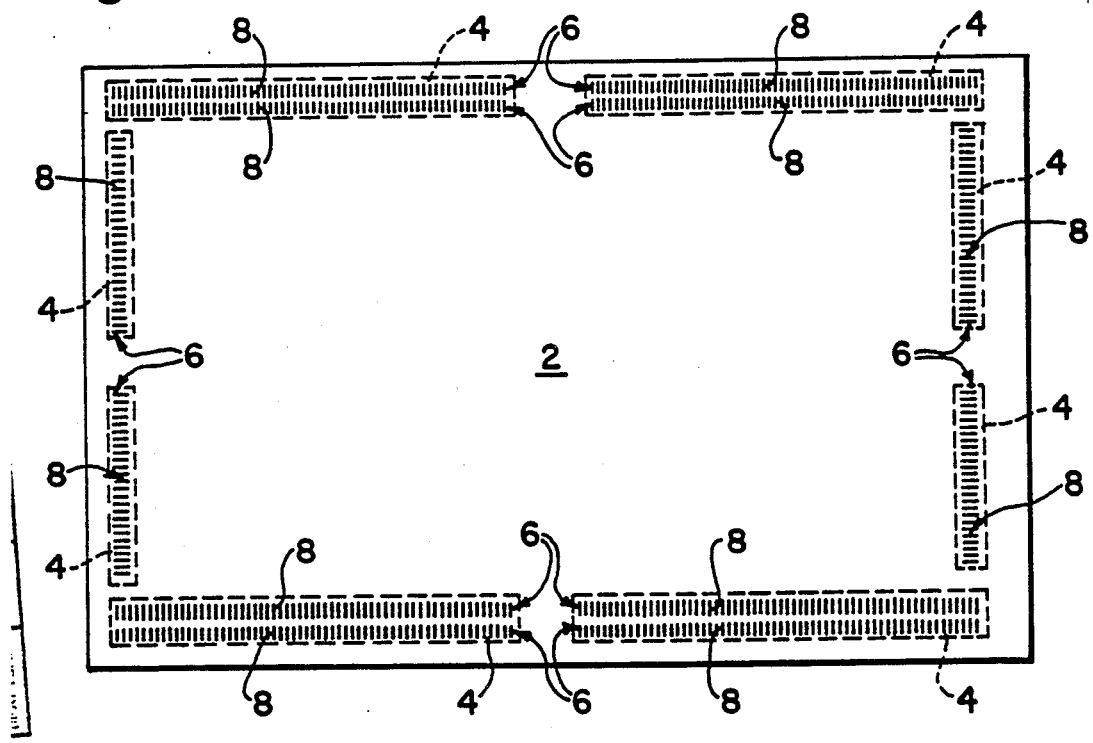
FIG. 1 is a contact pad surface view of a prior art ELP that is suitable for use with the connector according to the present invention.

Referring to the drawings, wherein like reference characters designate like or corresponding parts throughout the views, FIG. 1 is a contact pad surface view of a typical electroluminescent panel (ELP) 2. The ELP 2 is typically a substantially planar structure with a glass substrate. The ELP 2 generally has contact clusters 4 arranged around the perimeter of the ELP 2.

Each contact cluster 4 typically has at least one contact row 6 of planar contact pads 8. For instance, the horizontally arranged contact clusters 4 in FIG. 1 are shown with two contact rows 6 each and the vertically arranged contact clusters 4 are shown with a single contact row 6 each. Of course, both the horizontally and vertically arranged contact clusters 4 can alternatively have a different number of the contact rows 6.

Figure 2:
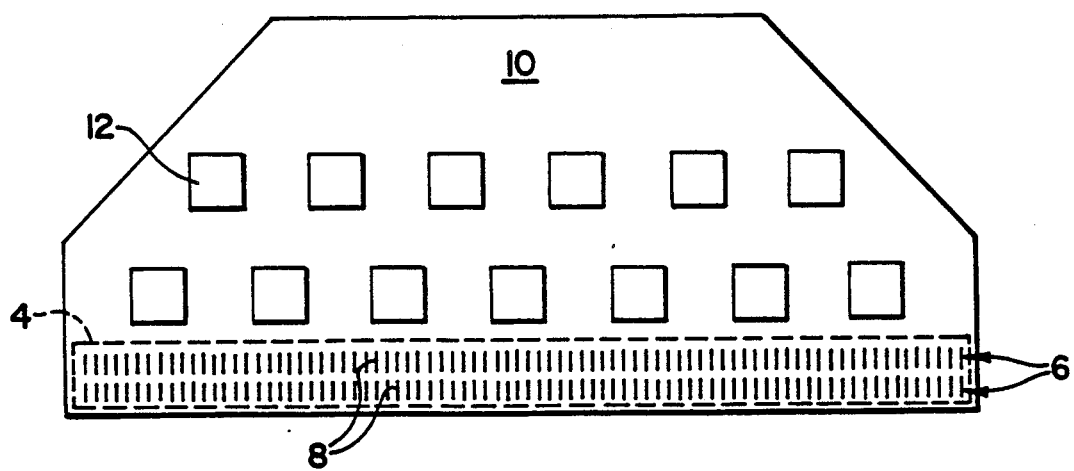
FIG. 2 is a contact pad surface view of a prior art FC that is suitable for use with the connector according to the present invention.

FIG. 2 is a contact pad surface view of a typical flexible circuit (FC) 10. The FC 10 has at least one contact cluster 4 with contact pads 8 arranged to register with at least one of the contact clusters 4 on the ELP 2. The FC 10 is shown in FIG. 2 with a single contact cluster 4, and the single contact cluster 4 with two contact rows 6 of the contact pads 8. The FC 10 with this configuration is suitable for mating with one of the horizontally arranged contact clusters 4 of the ELP 2 shown in FIG. 1.

The FC 10 typically has a set of drivers 12 that have their outputs coupled to respective contact pads 8 in the contact cluster 4. The ELP 2 of FIG. 1 and the FC 10 are according to the prior art, and do not themselves constitute the present invention. The connector of the present invention is adapted to interconnect these prior art devices so that the outputs of the drivers 12 in the FC 10 are electrically coupled to the ELP 2 through the contact pads 8 of their respective contact clusters 4.

FIG. 3 is a contact surface view of a pressure beam 14 for the connector according to the present invention. The pressure beam 14 includes at least one longitudinal channel 16 with a resilient pressure pad 18 mounted therein along the length of each channel 16. Two of the channels 16 are shown for the pressure beam 14 in FIG. 3. The pressure pads 18 may be fabricated of any material with the desired degree of elasticity. For instance, they may be strips of an elastomeric material or fluid-filled bladders.

Each pressure pad 18 protrudes from its respective mounting channel 16 above the contact surface of the pressure beam 14. The length of each of the pressure pads 18 and their spacing are determined to correspond to the length and spacing of contact rows 6 of the contact cluster 4 of the ELP 2 and the FC 10 that are to be interconnected.

FIG. 4 is a longitudinal edge view of the pressure beam 14 shown in FIG. 3. The pressure beam 14 is preformed with a parabolic curvature. Persons of ordinary skill in the art will recognize that a substantially straight resilient beam supported by its ends assumes a parabolic curvature where it is subjected to constant loading of sufficient magnitude along its length.

The pressure beam 14 according to the present invention provides constant loading with the opposite of this principle. That is, by positioning the pressure beam 14 against a substantially planar surface with its ends displaced from the planar surface and then clamping the ends flush against the planar surface, the pressure beam 14 exerts constant loading along the contact area with the planar surface.

The preformed curvature in the pressure beam 14 thus provides constant loading for a planar contact surface along the entire contact surface length of the pressure beam 14. The pressure beam 14 is placed against the surface of the planar contact surface with the ends of the pressure beam displaced from the opposite surface. The ends of the pressure beam are straightened flush against the planar contact surface by clamping the ends against the planar surface. According to the present invention, when the pressure beam 14 is clamped by its ends against an ELP 2-FC 10 connection interface along their respective contact clusters 4, the contact pads 8 of each of the respective contact clusters 4 are coupled under direct pressure along the entire contact surface of he pressure beam 14.

FIG. 5 is a cross-section of the ELP 2-FC 10 interface held together with the preferred embodiment of the connector according to the present invention. This connector has two of the pressure beams 14. FIG. 5 shows this connector in a view transverse to the longitudinal axes of the pressure beams 14.

The interface between the ELP 2 and the FC 10 is shown with two contact rows 6 of the contacts 8, although a single contact row 6 or more than two contact rows 6 may alternatively be present as described above. Each of the pressure beams 14 has a respective pressure pad 18 in an associated channel 16 for each of the contact rows 6. In this way, the loading provided by the pressure beams 14 against each other is concentrated along each of the contact rows 6.

Because compressive loading is equally and oppositely applied to each side of the ELP 2-FC 10 interface by the two pressure beams 14, even the delicate glass substrate of the ELP 2 is safely coupled to the FC 10. The pressure beams 14 may be clamped together by their ends with any convenient fastening system, such as with C-clamps. One such C-clamp 20 is shown in FIG. 5.

The pressure pads 18 in each of the pressure beams 14 are volumetrically constrained within their respective mounting channels 16 to prevent "cold flow" of the pressure pads 18 out of their channels between the mating surfaces of one of the pressure beams 14 and the ELP 2 and the other one of the pressure beams 14 and the FC 10. This three dimensional constraint is provided with the pressure pads 18 each comprising a soft, solid-elastomer strip whose volume is notched to and substantially confined in its respective channel 16. This volumetric constraint of the pressure pads 18 is important to insure a fault-free connection between the ELP 2 and the FC 10.

Figure 6:
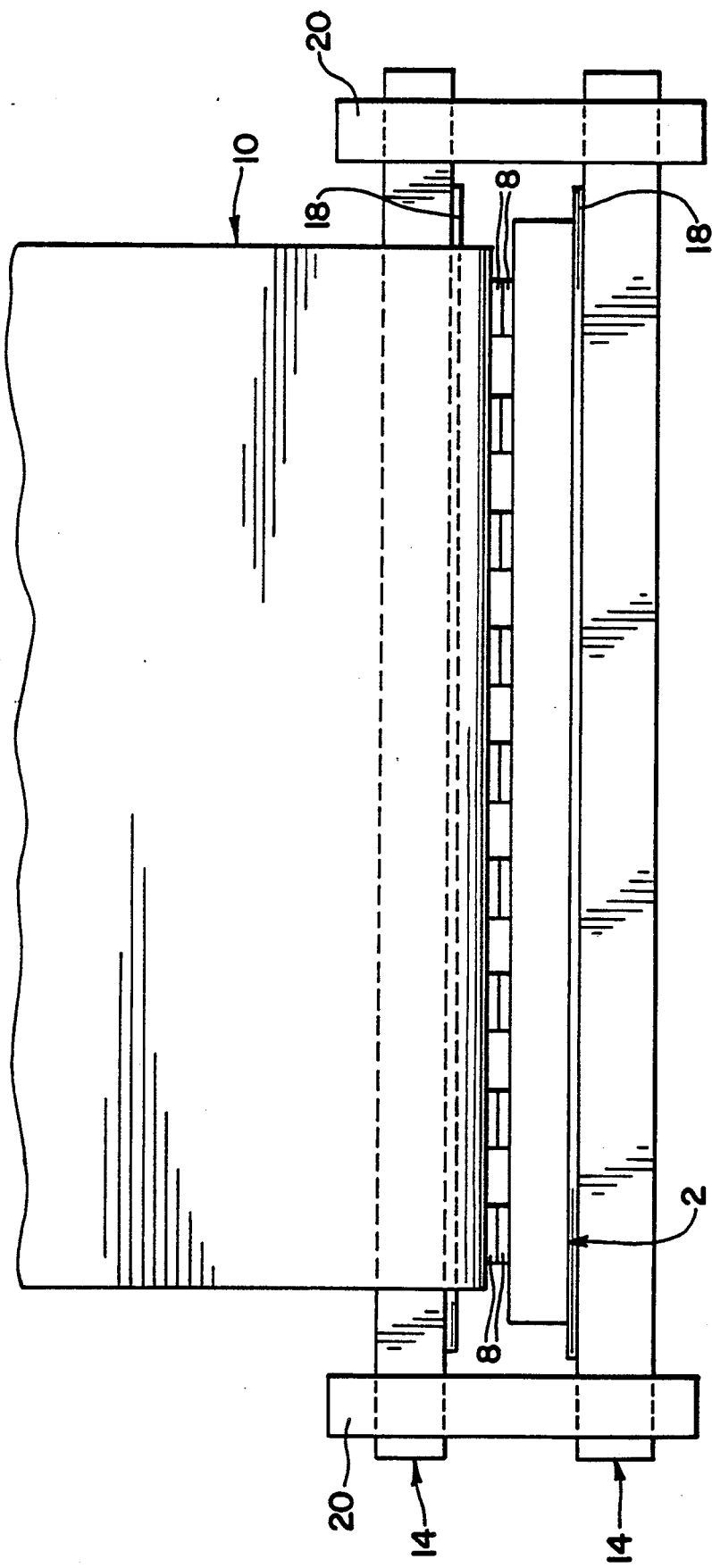
FIG. 6 is a side view of the embodiment of the connector according to the present invention shown in FIG. 5.

FIG. 6 is a side view of the preferred embodiment of the connector according to the present invention. FIG. 6 shows this connector in a view parallel to the longitudinal axes of the pressure beams 14. FIG. 6 shows how the C-clamps 20 fasten the ends of the pressure beams 20 together. The C-clamps 20 may be of the push-on, "dead" type, as shown in FIG. 6, or of the adjustable, "live" type, with a set screw for providing the desired amount of clamping.

Although the preferred embodiment of the connector according to the present invention has been described for use as a removable interconnect between an ELP and a FC, the connector is also useable for a wide variety of other interconnect applications where it is desirable to couple clusters of contact pads on substantially planar circuit substrates together, such as between two circuit boards, between a circuit board and a ribbon cable termination, and between two ribbon cable terminations.

Thus there has been described herein a simple and compact removable interconnect for coupling clusters of contact pads on substantially planar circuit substrates together with uniform loading on all of the contact pads in the clusters. It will be understood that various changes in the details, components, arrangement of parts and applications described herein in order to explain the nature of the invention may be made by those skilled in the art within the principle and scope of the present invention as expressed in the appended claims.

What is claimed is:

1. A connector for interconnecting a cluster of contact pads on a first substantially planar substrate to a cluster of contact pads on a second substantially planar substrate, comprising:
   a first curved pressure beam positioned against the surface of said first planar substrate opposite said cluster of contact pads on said first substrate, the ends of said first pressure beam being displaced from said opposite surface of said first substrate;
   a second curved pressure beam positioned against the surface of said second planar substrate opposite said cluster of contact pads on said second substrate, the ends of said second pressure beam being displaced from said opposite surface of said second substrate; and
   clamping means for holding the ends of said first pressure beam against said opposite surface of said first substrate and the ends of said second pressure beam against said opposite surface of said second substrate for coupling the cluster of contact pads on said first substrate to the cluster of contact pads on said second substrate under direct pressure with substantially equal loading.

2. The connector recited in claim 1, wherein the curvature of said first and second pressure beams is substantially parabolic.

3. The connector recited in claim 1, wherein said first substrate comprises an electroluminescent panel.

4. The connector recited in claim 1, wherein said second substrate comprises a flexible circuit.

5. The connector recited in claim 1, wherein said clamping means comprises at least one C-clamp.

6. The connector recited in claim 5, wherein said clamping means further comprises two of said C-clamps, with each of said C-clamps mounted between respective ends of said first and second pressure beams.

7. The connector recited in claim 1, wherein said first and second pressure beams each include at least one resilient pressure pad.

8. The connector recited in claim 7, wherein said resilient pads comprise liquid-filled bladders.

9. The connector recited in claim 8, further comprising mounting channels in each of said pressure beams for retaining each of said bladders.

10. The connector recited in claim 9, wherein each of said bladders comprises a fixed volume, liquid-filled elongated bladder.

11. The connector recited in claim 7, wherein said resilient pads comprise elastomeric strips.

12. The connector recited in claim 11, further comprising mounting channels in each of said pressure beams for retaining each of said elastomeric strips.

13. The connector recited in claim 12, wherein each of said elastomeric strips comprises a soft, solid-elastomer strip having a volume substantially matched to and substantially confined in its respective one of said mounting channels.

14. A connector for interconnecting a cluster of contact pads on a first substantially planar substrate to a cluster of contact pads on a second substantially planar substrate, comprising:
   a first pressure beam having a substantially parabolic curvature with at least one longitudinal pressure pad along a surface of said first pressure beam positioned against the surface of said first planar substrate opposite said cluster of contact pads on said first substrate, the ends of said first pressure beam being displaced from said opposite surface of said first substrate;
   a second pressure beam having a substantially parabolic curvature with at least one longitudinal pressure pad along a surface of said second pressure beam positioned against the surface of said second planar substrate opposite said cluster of contact pads on said second substrate, the ends of said second pressure beam being displaced from said opposite surface of said second substrate; and
   clamping means for holding the ends of said first pressure beam against said opposite surface of said first substrate and the ends of said second pressure beam against said opposite surface of said second substrate for coupling the cluster of contact pads on said first substrate to the cluster of contact pads on said second substrate under direct pressure with substantially equal loading.

15. The connector recited in claim 14, wherein said first substrate comprises an electroluminescent panel.

16. The connector recited in claim 14, wherein said second substrate comprises a flexible circuit.

17. The connector recited in claim 14, wherein said clamping means comprises at least one C-clamp.

18. The connector recited in claim 17, wherein said clamping means further comprises two of said C-clamps, with each of said C-clamps mounted between respective ends of said first and second pressure beams.

19. The connector recited in claim 14, wherein said resilient pads comprise liquid-filled bladders.

20. The connector recited in claim 19, further comprising mounting channels in each of said pressure beams for retaining each of said bladders.

21. The connector recited in claim 20, wherein each of said bladders comprises a fixed volume, liquid-filled elongated bladder.

22. The connector recited in claim 14, wherein said resilient pads comprise elastomeric strips.

23. The connector recited in claim 22, further comprising mounting channels in each of said pressure beams for retaining each of said elastomeric strips.

24. The connector recited in claim 23, wherein each of said elastomeric strips comprise a soft, solid-elastomer strip having a volume substantially matched to and substantially confined in its respective one of said mounting channels.

25. A connector for interconnecting a cluster of contact pads on a first substantially planar substrate to a cluster of contact pads on a second substantially planar substrate, comprising:
   a first pressure beam having a substantially parabolic curvature with at least one longitudinal pressure pad recessed in a corresponding mounting channel along a surface of said first pressure beam positioned against the surface of said first planar substrate opposite said cluster of contact pads on said first substrate, the ends of said first pressure beam being displaced from said opposite surface of said first substrate;
   a second pressure beam having a substantially parabolic curvature with at least one longitudinal pressure pad recessed in a corresponding mounting channel along a surface of said second pressure beam positioned against the surface of said second planar substrate opposite said cluster of contact pads on said second substrate, the ends of said second pressure beam being displaced from said opposite surface of said second substrate; and at least one C-clamp for holding the ends of said first pressure beam against said opposite surface of said first substrate and the ends of said second pressure beam against said opposite surface of said second substrate for coupling the cluster of contact pads on said first substrate to the cluster of contact pads on said second substrate under direct pressure with substantially equal loading.

26. The connector recited in claim 25, wherein said first substrate comprises an electroluminescent panel.

27. The connector recited in claim 25, wherein said second substrate comprises a flexible circuit.

28. The connector recited in claim 25, wherein said connector further comprises two of said C-clamps, with each of said C-clamps mounted between respective ends of said first and second pressure beams.

29. The connector recited in claim 25, wherein said resilient pads comprise elastomeric strips.

30. The connector recited in claim 25, wherein said resilient pads comprise liquid-filled bladders.

31. The connector recited in claim 30, wherein each of said bladders comprises a fixed volume, liquid-filled elongated bladder.

32. The connector recited in claim 31, wherein each of said elastomeric strips comprise a soft, solid-elastomer strip having a volume substantially notched to and substantially confined in its respective one of said mounting channels.

* * * * *